United States Patent [19]
Masdea et al.

[11] Patent Number: 5,115,208
[45] Date of Patent: May 19, 1992

[54] PLL CLOCK SIGNAL REGENERATOR USING A PHASE CORRELATOR

[75] Inventors: Arturo Masdea; Rosanna Masucci, both of Pomezia; Manuel Bignami, Rome; Roberto Bartolomei, Ariccia, all of Italy

[73] Assignee: Selenia Industrie Elettroniche Associate S.p.A., Rome, Italy

[21] Appl. No.: 557,311

[22] Filed: Jul. 23, 1990

[30] Foreign Application Priority Data

Jul. 21, 1989 [IT] Italy .................. 48218 A/89

[51] Int. Cl.⁵ .................................. H03L 7/087
[52] U.S. Cl. ........................ 331/1 A; 307/516; 328/133; 328/155; 331/12; 331/27; 375/120
[58] Field of Search ........... 331/1 A, 25, 27, 12; 375/120; 307/516; 328/133, 134, 155

[56] References Cited

U.S. PATENT DOCUMENTS

| | | | |
|---|---|---|---|
| 3,961,273 | 6/1976 | Trush | 328/155 |
| 4,151,463 | 4/1979 | Kibler | 331/25 X |
| 4,422,176 | 12/1983 | Summers | 331/27 X |

Primary Examiner—Siegfried H. Grimm
Attorney, Agent, or Firm—Cohen, Pontani & Lieberman

[57] ABSTRACT

A circuit for the regeneration of the clock signal within a message containing a preamble and random data. No assumption as to the message structure is required for the operation of such a circuit. The circuit operates on an autocorrelation principle which allows a voltage controlled oscillator (VCO) which is used to reconstruct the clock signal to operate free of the data format. The device is essentially formed as a phase correlator connected to a feedback loop which contains in series a filter, an amplifier and a voltage controlled oscillator. The correlator is formed by a delay line feeding a delayed data signal to two multipliers. The data is also fed to a shift register, the output of which is also fed to the multipliers. The multiplier outputs are fed to a differentiating element which outputs an error signal which acts as a clock correction signal feeding the VCO which, when necessary, adjusts the VCO output so as to match the clocking within the circuit with the clock timing of the message received.

11 Claims, 2 Drawing Sheets

PLL CLOCK SIGNAL REGENERATOR USING A PHASE CORRELATOR

FIELD OF THE INVENTION

This invention relates to a circuit which is capable of reconstructing and regenerating a clock signal from within a transmitted message. The invention comprises a feedback loop which is capable of sensing the proper clock timing and phase of a data stream and adjusting a variable clock generator to the proper timing necessary to match that of the message.

BACKGROUND OF THE INVENTION

In transmission systems dealing with data communications, information processing and electronic messaging, it is often desirable to be able to extract the clock timing of a particular message from the message itself rather than have to transmit it separately or along with the message. At present, the most common devices used for clock regeneration are Phase Locked Loops (PLL), early-late gates, and the Costas Loop. These clock regeneration systems utilize a message structure (PLL), frequency (early-late gate), or lock-on time (Costas Loop) methodology. Therefore, in general purpose applications such as transmission on avionic buses, where there is a need for clock reconstruction in very short times from a coded signal or message which may or may not have a preamble, conventional systems as previously mentioned prove inadequate and are inapplicable.

It would therefore be highly desirable to provide a device which overcomes the limitations of the currently known clock regeneration systems, while doing it in a way which offers high reliability and small dimensions.

OBJECTS AND SUMMARY OF THE INVENTION

The present invention relates to a device which can be used in electronic data communications and messaging systems for the purpose of reconstructing and regenerating a clock signal from within a given message, whether or not that message contains a preamble. The device makes possible clock reconstruction in very short times starting from the beginning of a received message. The device is believed to be particularly useful as applied to transmission systems used in the aviation field, particularly on avionic buses, since the circuit offers high reliability and small dimensions. The device is operational over a frequency range spanning from a few Hertz (Hz) up through tens of MHz. The device is simple to construct and can be implemented by means of Application Specific Integrated Circuits (ASIC) or by hybrid techniques.

The device contains a phase correlator circuit which has an input for receiving the data message, and input for receiving a clock signal, and an output for outputting a clock correction signal. A feedback loop is placed between the output of the phase correlator and the clock input of the phase correlator. The feedback loop contains in series a filter, an amplifier, and a voltage controlled oscillator (VCO). The clock correction signal which is generated by the phase correlator, after being filtered and amplified, serves as an input signal to the VCO which provides the clock signal to the circuit. The VCO will adjust the clock signal provided to the circuit in response to the clock correction signal.

The clock correction signal is formed by obtaining the difference between the output of two phase comparators. A first phase comparator has as its input the data signal, delayed by a given delay period, and the data signal shifted by a shift register which shifts the signal by one-half of one clock period. The second phase comparator has as its input the same delayed signal as is fed to the first phase comparator, however the second input of the second phase comparator is the input signal shifted by a shift register which shifts the input signal by three-halves of one clock period. There will be a balance between the outputs of the two phase comparators when the delayed data signal lags the two shifted data signals by 90°. Since the circuit acts on data as it is received, clock reconstruction is possible in very short times beginning with the start of any coded signal, without the need for a preamble.

It is therefore an object of the invention to provide a device which extracts the clock signal from a message whether or not that message is preceded by a preamble.

It is also an object of this invention to provide a circuit which can operate on random data without any particular format defined during the design phase of the transmission system.

It is a further object of the invention to provide a device which is capable of maintaining a preset tracking error compatible with the required specifications of the transmission system.

It is a further object of the present invention to provide a clock regeneration device suitable for ground-based, shipborne and avionic data communications systems.

Other objects and features of the present invention will become apparent from the following detailed description considered in conjunction with the accompanying drawings. It is to be understood, however, that the drawings are designed solely for the purposes of illustration and not as a definition of the limits of the invention, for which reference should be made to the appended claims.

DETAILED DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
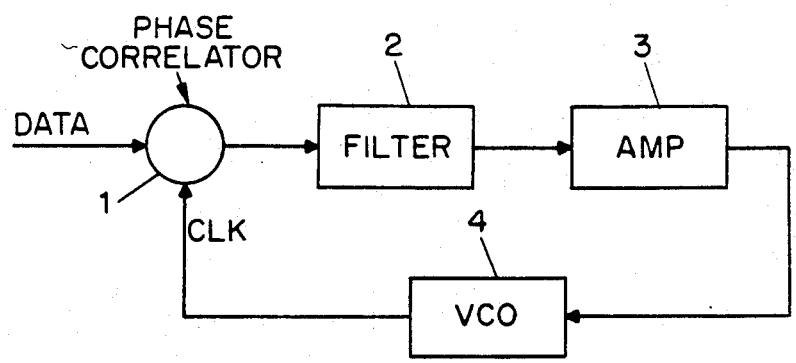
FIG. 1 illustrates a block diagram of the clock regenerator of the present invention.

FIG. 1 shows an operative configuration for the clock regenerator of the instant invention. A voltage controlled oscillator (VCO) 4 provides clocking for the circuit. Data enters the phase correlator 1 and if the clock timing of the data does not match the clock signal provided by the VCO 4, a clock error signal, alternately called a clock correction signal, is generated in the phase correlator and fed through filter 2 and amplifier 3 to the input of VCO 4. VCO 4 adjusts the clock timing until the VCO clock output matches the clock timing of the data.

Figure 2:
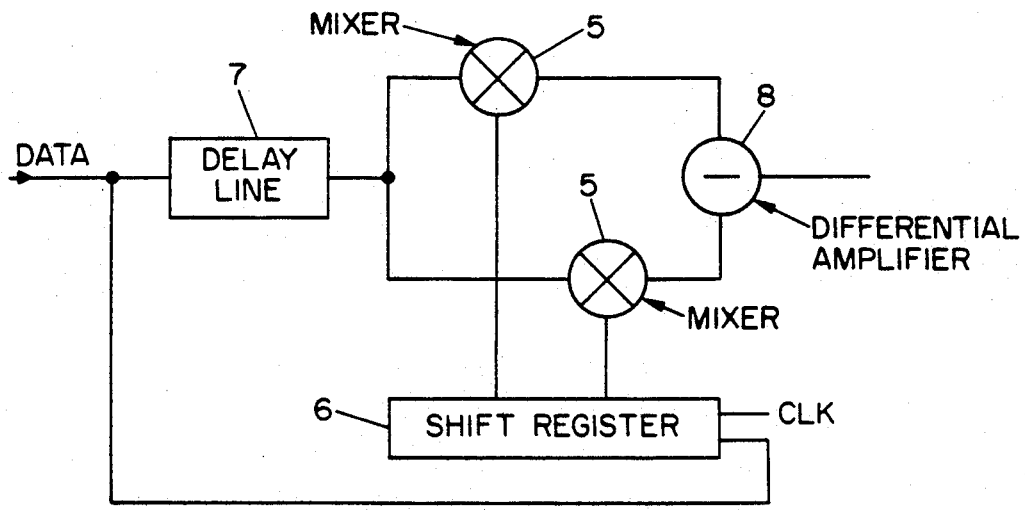
FIG. 2 illustrates a block diagram of the phase correlator circuit of the device of present invention.

FIG. 2 shows a block diagrammatic representation of the operational elements of phase correlator 1 shown in FIG. 1. The data signal is fed through a delay line 7 and to shift register 6. Delay line 7 outputs a delayed data signal to mixers 5, (also known in the art as multipliers). Shift register 6 has two outputs which are individually fed to each of the two mixers 5. The output of mixers 5 is fed to a differential amplifier 8, the output of which is the clock correction signal which feeds VCO 4 through filter 2 and amplifier 3.

Figure 5:
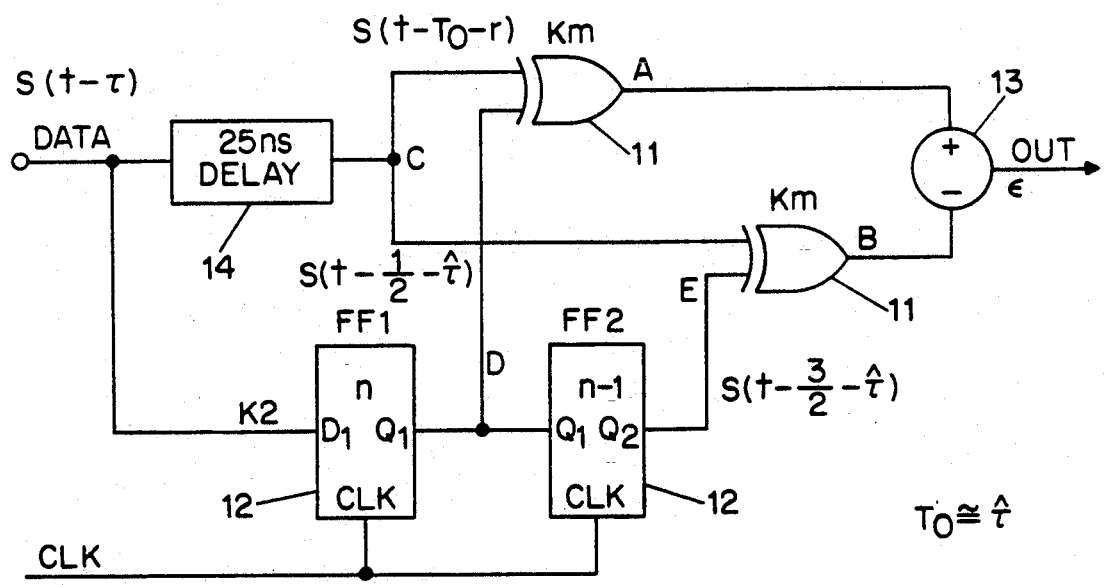
FIG. 5 is a circuit diagram of the phase correlator shown in FIG. 2.

FIG. 5 is a circuit diagram which depicts a particular embodiment of the phase correlator shown in FIG. 2. Delay line 7 is shown as a 25ns delay line 14. Mixers 5 are shown as exclusive OR gates 11. Shift register 6 is shown implemented as two series connected flip-flops 12.

Figure 3:
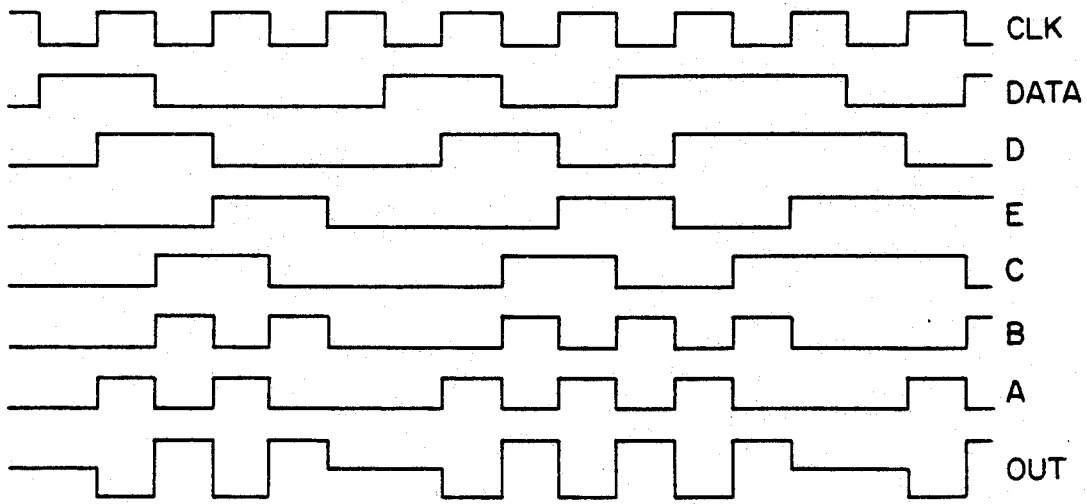
FIG. 3 is a representation of the signal wave forms present in the phase correlator during operation.
Figure 4:
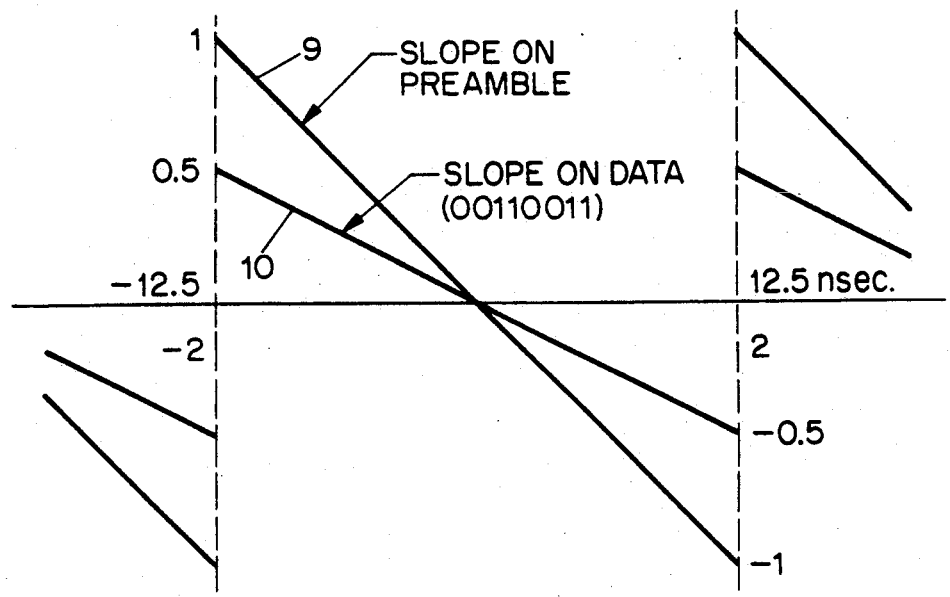
FIG. 4 is a graphical representation showing the slope of the gain of the circuit of the present invention.

FIG. 3 is a representation of the signals present in the circuit depicted in FIG. 5. Signal C is the output of delay line 14. Signals A and B are the respective outputs of exclusive OR gates 11. Signal D is the output of the first flip-flop 12. Signal E is the output of second flip-flop 12. The output of differential amplifier 13, which serves as an error signal or clock correction signal, is shown as signal OUT. A graphical representation of the gain of this circuit is shown in FIG. 4, wherein line 9 represents the gain of the circuit during the preamble of a message with a preamble, and line 10 represents the gain of the circuit when the data acted upon is the message itself.

The operation of the device may be briefly outlined by noting that the input signal is correlated with two identical signals synchronized by the clock, one ahead of the other by one clock step. This relationship can be seen in FIG. 3. This way there is a balanced situation only if the signal at the output of the delay line 13, represented in FIG. 3 as signal C, is lagging the two synchronized signals D and E by 90°.

The affect can easily be visualized when the input data is deterministic; when it becomes random, the output signal OUT of differentiating element 13 produces time intervals when the signal OUT, which acts as the clock correction signal, is zero.

At any rate, no violent transient at the correlator output takes place when the data changes, but rather there is a rapid adjustment which eliminates the transients due to the fact that after the time intervals at which the error or clock correction signal is zero, the error signal always starts with the same phase which it would have had in the presence of deterministic data.

This is what makes tracking possible during the random data, with no loss of information which may have been acquired during the preamble.

From the description above, it can be seen that the device may be implemented utilizing either analog or digital components.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, however, therefore, to be limited only as indicated by the scope of the claims appended hereto.

We claim:

1. A device for the extraction and generation of a clock signal from a clocked digital data signal having a data clock timing and phase, wherein the generated clock signal has a clock period and phase which is variable so as to be in fixed relation with the data clock timing and phase of said digital data signal, said device comprising:

clock generation means for outputting a clock signal having a variable clock period and phase;

phase correlation means for correlating the phase of said clock signal with the phase of said data signal, said phase correlation means comprising:

a data input for receiving said digital data signal;

a clock signal input for receiving said clock signal;

delay means for introducing a delay in said digital data signal, said delay means outputting a delayed data signal;

a first and a second shift register, each shift register shifting a respective input signal in response to said clock signal, said first shift register receiving as an input to be shifted said data signal and having as an output a first time shifted data signal shifted by one-half of one clock period, said second shift register receiving as an input to be shifted said first time shifted data signal from said first shift register and having as an output a second time shifted data signal shifted by three-halves of one clock period;

a first phase comparator and a second phase comparator, said first phase comparator having as inputs said delayed data signal and said first time shifted data signal and having a first phase comparator output, and said second phase comparator having as inputs said delayed data signal and said second time shifted data signal and having as an output a second phase comparator output; clock correction signal forming means for receiving said first and said second phase comparator outputs and producing at an output of said phase correlation means a clock correction signal; and said clock generation means being connected between said output of said phase correlation means and said clock signal input of said phase correlation means and responsive to said clock correction signal, so that said clock generation means outputs to said clock signal input of said phase correlation means a generated clock signal varied in response to said clock correction signal so as to have a clock period and phase in fixed relation with the clock timing and phase of said digital data stream.

2. The device according to claim 1, wherein said clock generation means is a voltage controlled oscillator.

3. The device according to claim 1, wherein said first and said second phase comparators are respectively comprised of an exclusive-OR gate.

4. The device according to claim 1, wherein the delay introduced in said digital data is a 90 degree delay.

5. The device according to claim 1, wherein the delay introduced in said digital data is a twenty-five nanosecond delay.

6. The device according to claim 1, wherein said first and said second shift registers are respectively comprised of a flip-flop.

7. The device according to claim 1, wherein said clock correction signal forming means is comprised of a differential amplifier.

8. The device according to claim 1, wherein said clock correction signal forming means produces at an output of said phase correlator a clock correction signal proportional to the difference between said first and second phase comparator outputs.

9. The device according to claim 7, wherein said clock correction signal forming means produces at an output of said phase correlator a clock correction signal proportional to the difference between said first and said second phase comparator outputs.

10. The device according to claim 1, further comprising:
   filter means for filtering said clock correction signal, said filter means having an input connected to said phase correlation means output for receiving said clock correction signal and an output for outputting a filtered clock correction signal; and
   amplifying means for amplifying said filtered clock correction signal, said amplifying means having an output connected to said filter means output for receiving said filtered clock correction signal and an output for outputting to said clock generation means an amplified filtered clock correction signal.

11. A device for the extraction of a clock signal, produced by a clock regeneration circuit responsive to an output of said device, from a clocked data stream having a clock period, said device comprising:
   a data signal input for receiving said clocked data stream;
   a clock signal input for receiving a regenerated clock signal;
   delay means for introducing a delay in said data signal and forming a delayed data signal;
   a temporal shift register having at least two storage registers for storing samples of said data signal and having a first tap for outputting the contents of a storage register delayed by one half of one clock period and a second tap for outputting the contents of a storage register delayed by three halves of one clock period, said storing of said samples being controlled according to said clock signal;
   a first phase comparator and a second phase comparator, said first phase comparator having as inputs said delayed data signal and said output from said first tap of said shift register and having a first phase comparator output, said second phase comparator having as inputs said delayed data signal and said output from said second tap of said shift register and having as an output a second phase comparator output; and
   clock correction signal forming means for receiving said first and said second phase comparator outputs and producing at an output of said device a clock correction signal for correcting a phase of said regenerated clock input signal.

* * * * *